(12) United States Patent
Lee et al.

(10) Patent No.: US 9,286,984 B2
(45) Date of Patent: Mar. 15, 2016

(54) REDUCED SIZE SEMICONDUCTOR DEVICE AND METHOD FOR MANUFACTURE THEREOF

(71) Applicant: MACRONIX INTERNATIONAL CO., LTD, Hsinchu (TW)

(72) Inventors: Ya Jui Lee, Taichung (TW); Kuan Fu Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/324,743

(22) Filed: Jul. 7, 2014

(65) Prior Publication Data

US 2016/0005468 A1    Jan. 7, 2016

(51) Int. Cl.

| G11C 16/04 | (2006.01) |
|---|---|
| G11C 16/08 | (2006.01) |
| H01L 27/115 | (2006.01) |
| G11C 5/06 | (2006.01) |
| G11C 16/16 | (2006.01) |
| G11C 16/12 | (2006.01) |
| G11C 16/26 | (2006.01) |
| H01L 21/768 | (2006.01) |

(52) U.S. Cl.
CPC .............. *G11C 16/08* (2013.01); *G11C 5/063* (2013.01); *G11C 16/0483* (2013.01); *G11C 16/12* (2013.01); *G11C 16/16* (2013.01); *G11C 16/26* (2013.01); *H01L 21/768* (2013.01); *H01L 27/1157* (2013.01); *H01L 27/11524* (2013.01)

(58) Field of Classification Search
USPC ................... 365/185.17, 185.33, 185.05, 63
See application file for complete search history.

(56) References Cited

U.S. PATENT DOCUMENTS

| 2007/0047367 A1* | 3/2007 | Kim ........................ G11C 8/10 365/230.03 |
|---|---|---|
| 2011/0128791 A1* | 6/2011 | Chang ................. G11C 16/344 365/185.22 |

* cited by examiner

*Primary Examiner* — Vu Le
(74) *Attorney, Agent, or Firm* — Alston & Bird LLP

(57) ABSTRACT

A nonvolatile semiconductor device is provided that includes a substrate and a plurality of blocks forming a string. Each block is positioned on the substrate and includes a plurality of word lines disposed on the substrate. The string includes a single ground select line disposed at one side of the plurality of blocks, and a single string select line is disposed at another side of the plurality of blocks. In some embodiments, the word lines of the plurality of blocks define gaps separating each block of the string from neighboring blocks of the string. One or more dummy word lines may be disposed in each gap between blocks of the string. Corresponding methods of manufacturing the nonvolatile semiconductor device and manipulating the nonvolatile semiconductor device are provided.

13 Claims, 7 Drawing Sheets

REDUCED SIZE SEMICONDUCTOR DEVICE AND METHOD FOR MANUFACTURE THEREOF

TECHNOLOGICAL FIELD

Example embodiments of the present invention relate generally to semiconductor devices and, more particularly, to reduced size semiconductor devices that avoid word line disturbances.

BACKGROUND

Semiconductor devices may typically be classified as either volatile semiconductor devices, which require power to maintain storage of data, or non-volatile semiconductor devices, which can retain data even upon removal of a power source. An example non-volatile semiconductor device is a flash memory device, which generally includes an array of memory cells arranged in rows and columns. Each memory cell includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. The gate of a conventional flash memory cell generally comprises a dual-gate structure, including a control gate and a floating gate, wherein the floating gate is sandwiched between two dielectric layers to trap carriers, such as electrons, to program the cell.

Flash memory devices may in turn be classified as NOR or NAND flash memory devices. While NOR flash memory has its benefits, NAND flash memory typically offers faster program and erase speeds, in large part due to its serialized structure, whereby program and erase operations may be performed on strings of memory cells.

Despite the advantages of existing NAND flash memory, the semiconductor industry is increasingly driven towards smaller and even more capable electronic devices. In order to reduce the size of such devices while maintaining or improving their respective capabilities, the size of components within the devices, and the distances between those components, must be reduced.

With regard to NAND flash memory devices, issues arise that prevent reduction in size while maintaining the cell's capabilities and respective functions. For instance, the traditional string height of selected transistors and contacts has increasingly become an obstacle to reducing the scale of cell dimensions. These dimensions have proven difficult to scale because of leakage concerns caused by shrinking the distance between word lines and source lines. In this regard, gate-induced drain leakage (GIDL) current from a ground select line (GSL) can induce hot electron (hot-E) disturbance to cells adjacent to high threshold voltages. As a result, edge word lines often experience this disturbance.

Accordingly, there remains a need in the art to reduce the size of a NAND flash memory device while mitigating the potential for hot electron edge word line disturbance.

BRIEF SUMMARY OF EXEMPLARY EMBODIMENTS

In accordance with embodiments of the present invention, a nonvolatile semiconductor device is provided that both enables a reduction in chip size and avoids edge word line hot electron disturbance. As described herein, removal of ground source lines (GSLs) from a string comprising multiple blocks enables both a reduction in chip size and a reduction in the number of edge word lines that would otherwise be susceptible to hot electron disturbance. Moreover, in some embodiments, embodiments of the present invention utilize space and/or dummy word lines to prevent operations performed on one block from disturbing word lines of neighboring blocks. Accordingly, operations to program, erase, or read a cell function well, edge word line disturbance is mitigated, and the size of the chip can be substantially reduced.

In a first example embodiment, a nonvolatile semiconductor device is provided that includes a substrate and a plurality of blocks forming a string, wherein each block is positioned on the substrate and includes a plurality of word lines disposed on the substrate. Each block is positioned on the substrate and includes a plurality of word lines disposed on the substrate. The string includes a single ground select line disposed at one side of the plurality of blocks, and a single string select line is disposed at another side of the plurality of blocks. The nonvolatile semiconductor device may comprise a flash memory, and in particular may comprise a NAND flash memory.

In some embodiments, the word lines of the plurality of blocks define gaps separating each block of the string from neighboring blocks of the string. In this regard, one or more dummy word lines may be disposed in a gap between blocks of the string. In one embodiment, the dummy word line is a floating dummy word line. In another embodiment, the dummy word line has a voltage bias. In yet another embodiment, the dummy word line is connected to a ground. In other embodiments, the dummy word line may comprise a plurality of word lines.

In another example embodiment, a method of manufacturing the nonvolatile semiconductor device is provided. The method includes providing a substrate, and positioning a plurality of blocks on the substrate to form a string, wherein each block of the plurality of blocks includes a plurality of word lines disposed on the substrate. The method further includes forming a single ground select line associated with the string, wherein the single ground select line is disposed at one side of the plurality of blocks and forming a single string select line associated with the string, wherein the single string select line is disposed at another side of the plurality of blocks. The ground select line and the string select line may be disposed on opposite sides of the plurality of blocks.

In some embodiments of the method, positioning the plurality of blocks on the substrate includes defining, with the word lines of the plurality of blocks, gaps separating each block of the string from neighboring blocks of the string. In this regard, the method may include positioning a dummy word line in a gap separating two blocks of the plurality of blocks. To this end, in one embodiment, the dummy word line is a floating dummy word line. In another embodiment, the dummy word line has a voltage bias. In yet another embodiment, the dummy word line is connected to a ground. In other embodiments, the dummy word line comprises a plurality of word lines.

In yet another embodiment, a method of manipulating the nonvolatile semiconductor device is provided. In this regard, the method of manipulating the nonvolatile semiconductor device may include selecting a first block of the plurality of blocks forming the string, and performing an operation on the selected block.

In one such embodiment, the operation comprises an erase operation, wherein the bias applied to the plurality of word lines of the selected block to erase data stored in memory cells of the selected block is not applied to the dummy word line.

In another such embodiment, the operation comprises a program operation, wherein the bias applied to the plurality of word lines of the selected block to program memory cells of the selected block is not applied to the dummy word line.

In yet another such embodiment, the operation comprises a read operation, and a pass voltage is applied to the dummy word line.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE SEVERAL VIEWS OF THE DRAWINGS

Figure 1:
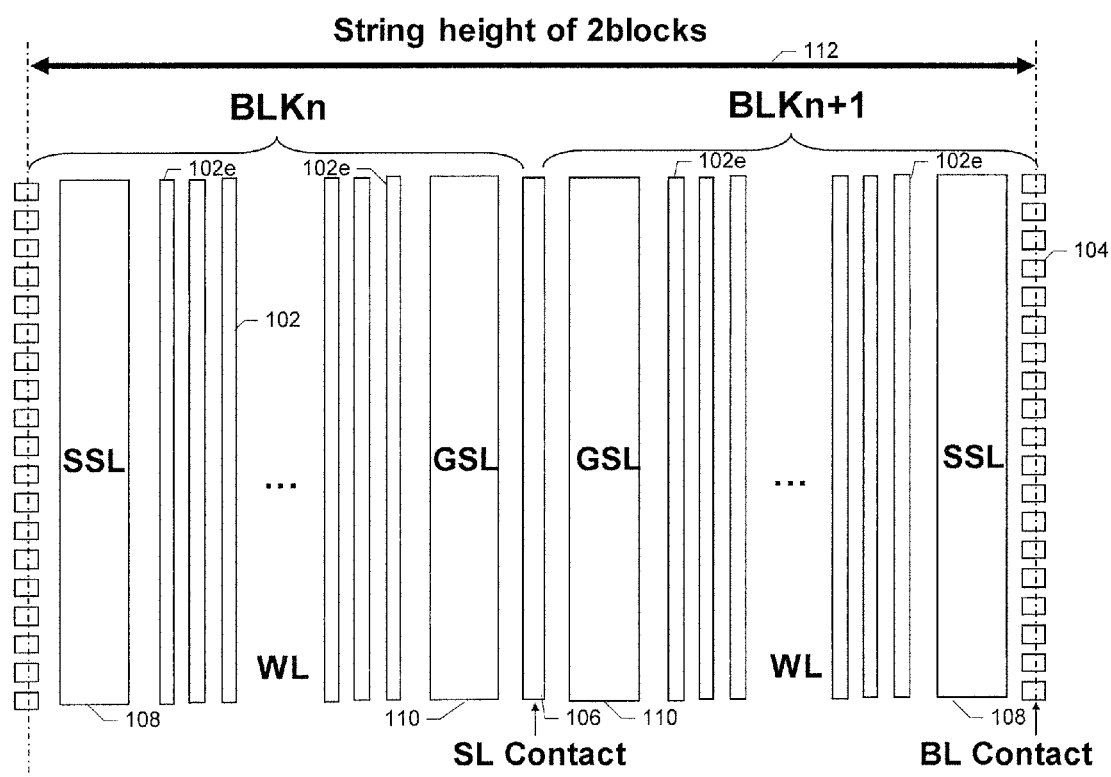
Figure 2:
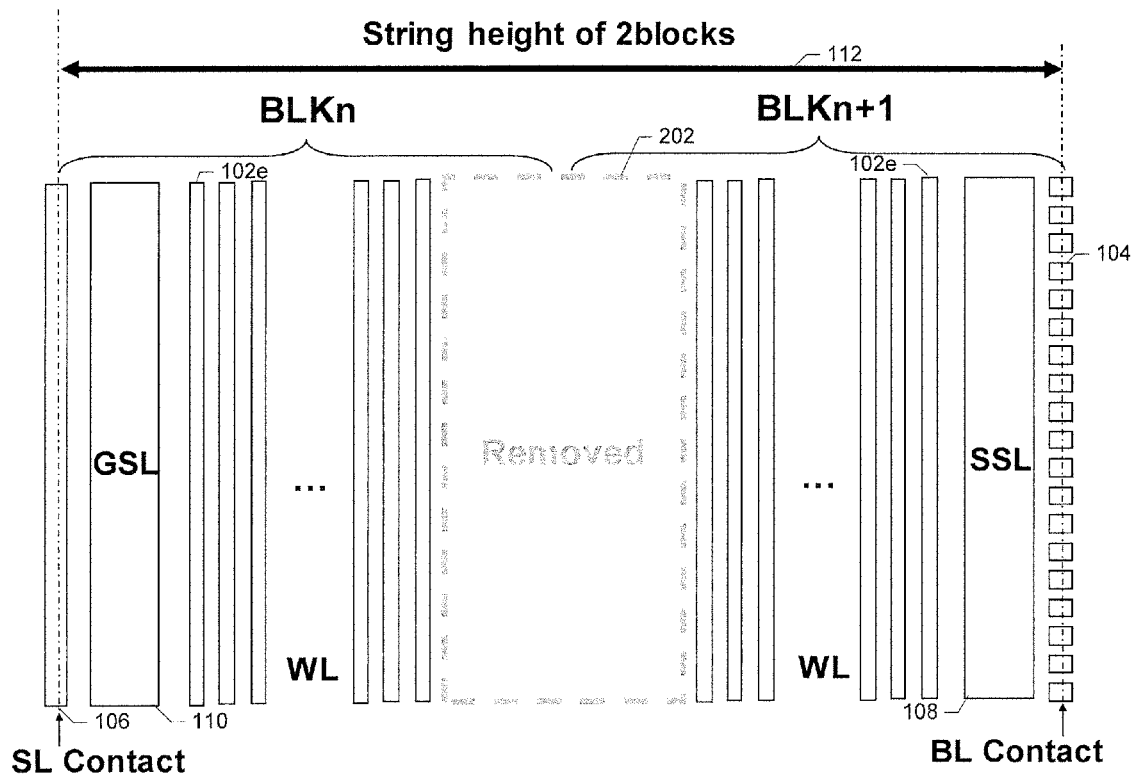
Figure 3:
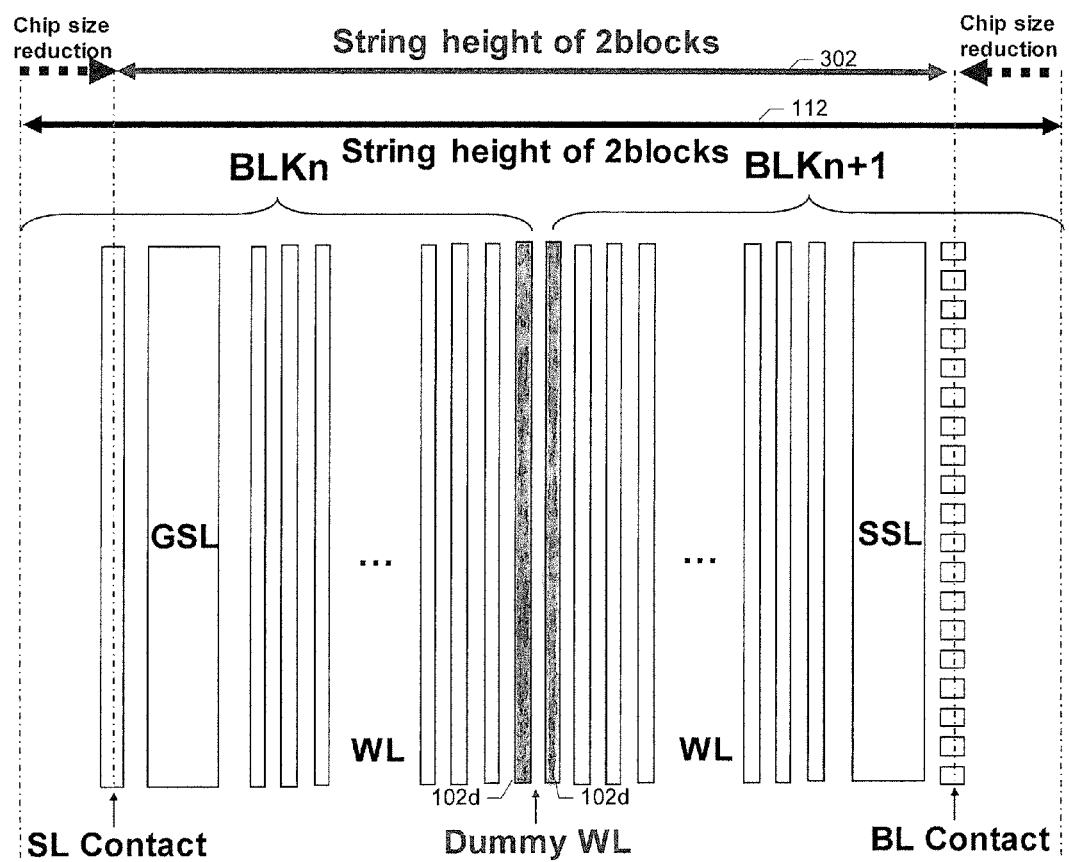
Figure 4:
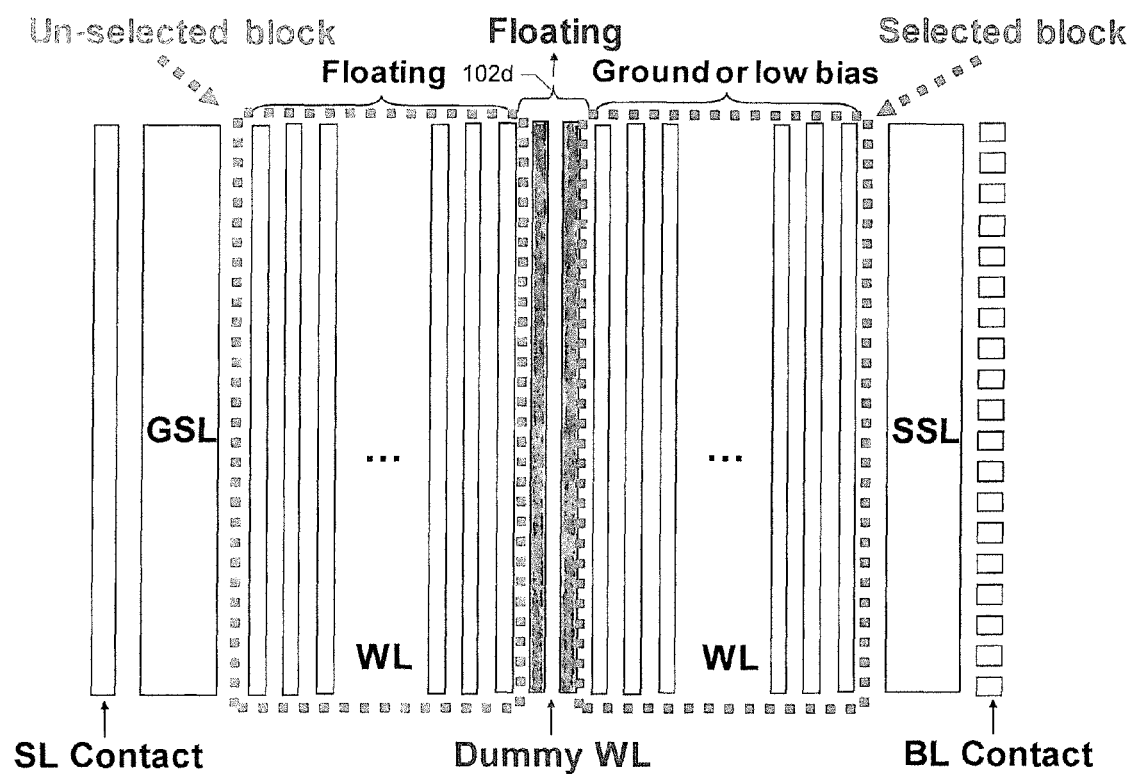
Figure 5:
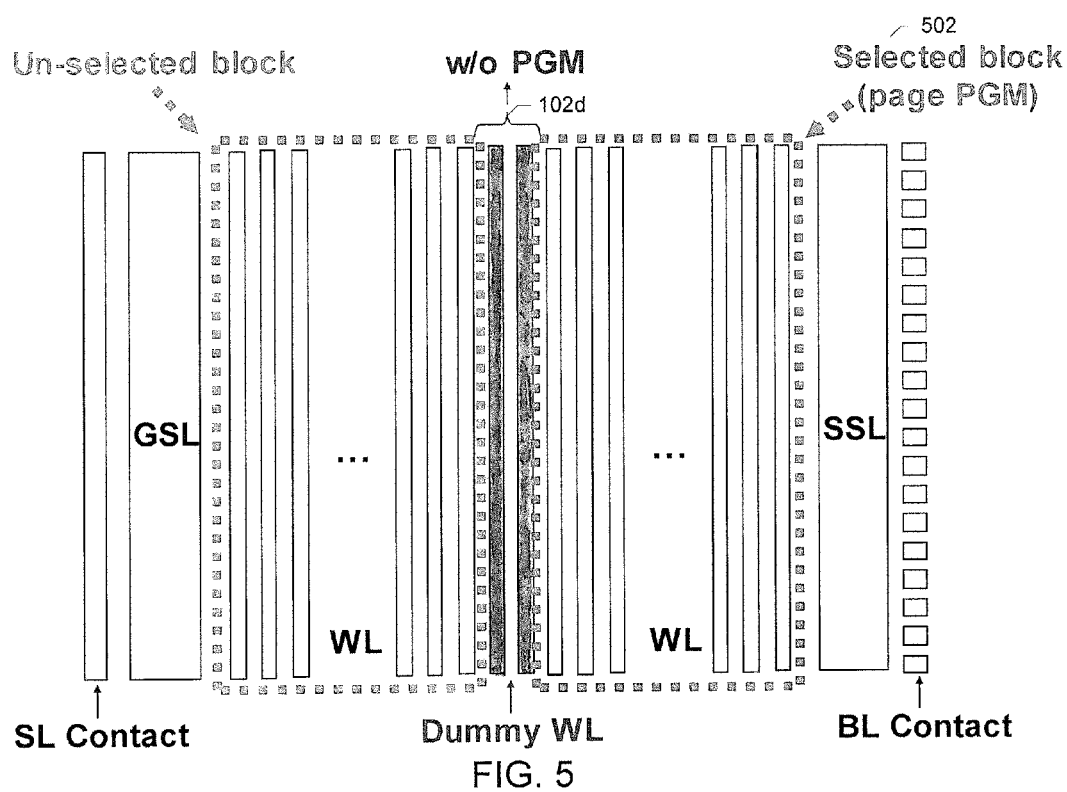
Figure 6:
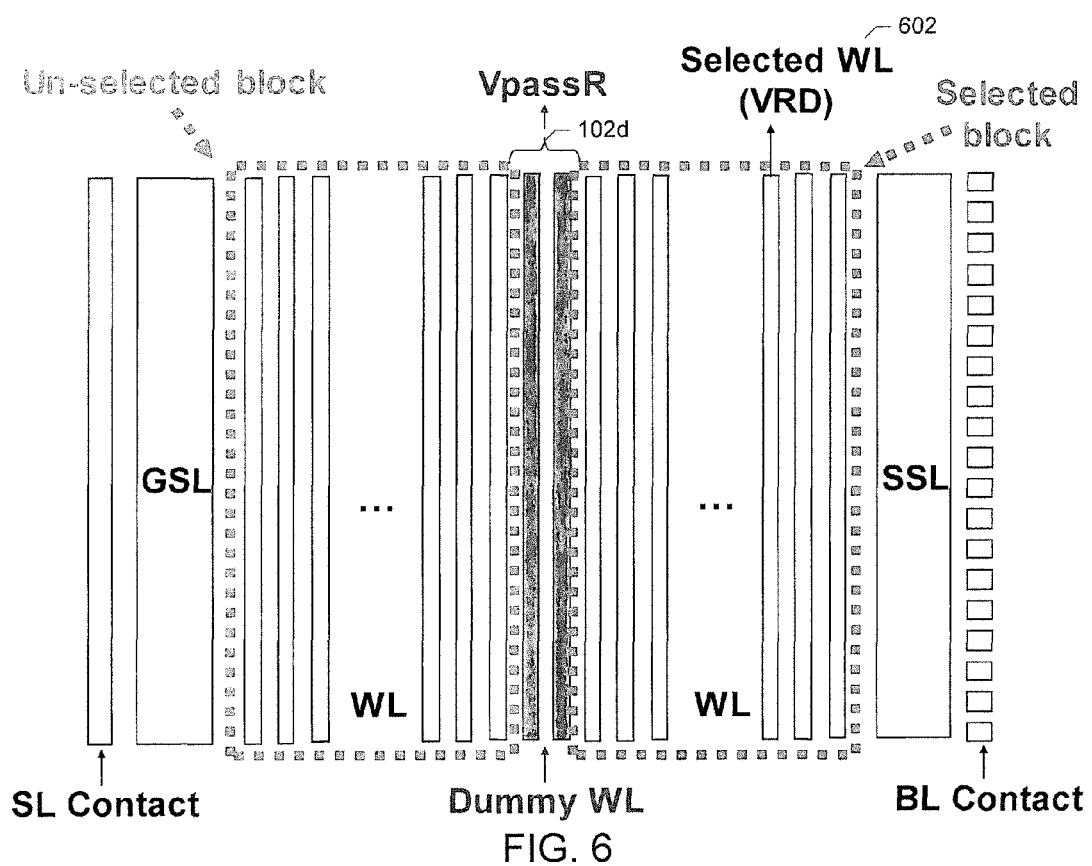
Figure 7:
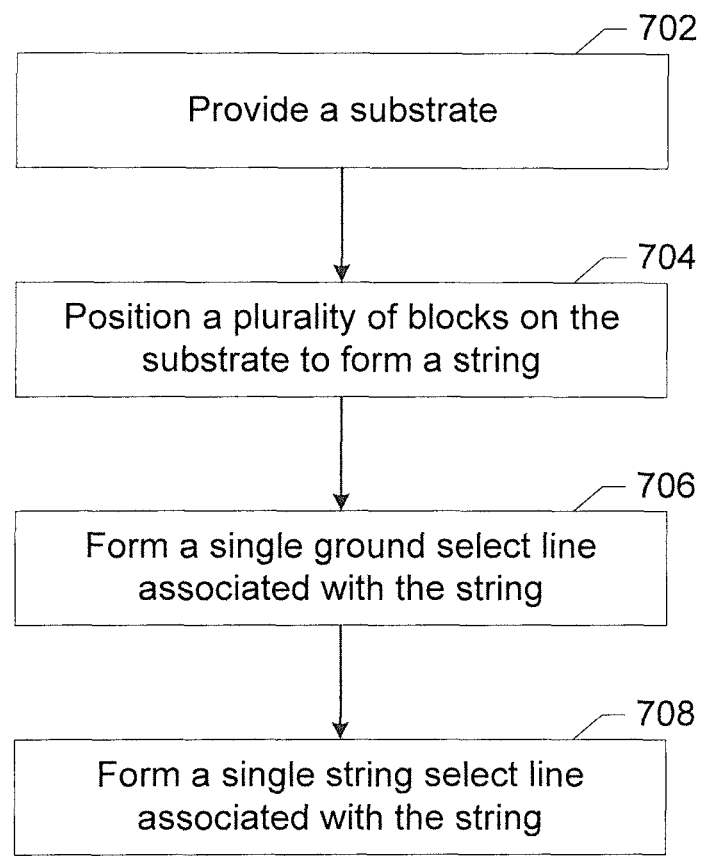

Having thus described certain example embodiments of the present disclosure in general terms, reference will now be made to the accompanying drawings, which are not necessarily drawn to scale, and wherein:

FIG. 1 illustrates a top view of a traditional flash memory device;

FIG. 2 illustrates a top view of a modification to a semiconductor device permitting a reduction in string height, in accordance with example embodiments of the present invention;

FIG. 3 illustrates a top view of a reduced-size semiconductor device, in accordance with example embodiments of the present invention;

FIGS. 4-6 illustrate example operations that may be performed using the reduced-size semiconductor device, in accordance with example embodiments of the present invention; and FIG. 7 illustrates a flowchart of operations performed to manufacture a semiconductor device in accordance with example embodiments of the present invention.

DETAILED DESCRIPTION

Some embodiments of the present invention will now be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

As used here, "non-volatile memory" refers to a semiconductor device which is able to store information even when the supply of electricity is removed from the memory. Non-volatile memory includes, without limitation, Mask Read-Only Memory, Programmable Read-Only Memory, Erasable Programmable Read-Only Memory, Electrically Erasable Programmable Read-Only Memory, and Flash Memory.

As used herein, a "substrate" may include any underlying material or materials upon which a device, a circuit, an epitaxial layer, or a semiconductor may be formed. Generally, a substrate may be used to define the layer or layers that underlie a semiconductor device or even forms the base layer of a semiconductor device. The substrate may include one or any combination of silicon, doped silicon, germanium, silicon germanium, semiconductor compounds, or other semiconductor materials.

Turning now to FIG. 1, a traditional nonvolatile semiconductor device is illustrated. The semiconductor device of FIG. 1 includes a plurality of blocks (two blocks $BLK_n$ and $BLK_{n+1}$ are shown in this embodiment, although additional blocks may be added to the semiconductor in a similar configuration). Each block includes a plurality of word lines 102 that intersect a plurality of bit lines 104. At each intersecting point, a memory cell is located that includes a gate, a drain, a source, and a channel defined between the drain and the source. As noted previously, the gate of each memory cell is connected to the word line, the drain is connected to the bit line, and the source is connected to a source line 106 positioned between neighboring blocks $BLK_n$ and $BLK_{n+1}$ that is connected to common ground. As further shown in FIG. 1, each block has a corresponding string select line 108 and ground select line 110.

Using this traditional semiconductor architecture, a string of two blocks has a corresponding height 112. However, to reduce overall chip size, the constituent elements of each block must be reduced in size and/or placed into closer relation to each other. However, as mentioned previously, by locating word lines in closer proximity with string select lines and ground select lines, there is a greater likelihood of hot electron edge word line disturbance. In this regard, because of the difference in potential between edge word lines 102e and the respective channel voltages of the string select line and ground select lines, a lateral electric field may be create that affects the edge word lines. In particular, the electric field may create hot electrons in the edge word lines 102e that may be injected into data layers associated with memory cells along the edge word lines. Edge word lines 102e may therefore be improperly programmed. In a similar fashion, by locating blocks in closer proximity to each other, program and erase operations may also introduce concomitant disturbances into edge word lines 102e of neighboring blocks. Accordingly, a need exists for a string configuration that enables smaller chip size while avoiding these disturbance problems.

FIG. 2 illustrates a top view of a modification to the semiconductor device enabling a reduction in string height, in accordance with example embodiments of the present invention. FIG. 2 also describes two blocks $BLK_n$ and $BLK_{n+1}$, but their configurations have been altered from those shown in FIG. 1. In this regard, FIG. 2 illustrates that the source line 106 has been moved to one side of the neighboring blocks, and only a single string select line 108 and a single ground select line 110 are provided. As a result, using the same string height 112, a gap 202 is provided between the neighboring blocks. Provision of such a large gap 202 reduces the probability of a disturbance caused to one of the blocks by a program or erase operation performed on the other block. Moreover, because only a single string select line 108 and a single ground select line 110 are employed, there is only one edge word line 102e associated with the string select line 108, and only a one edge word line 102e associated with the ground select line 110. Accordingly, whereas the traditional semiconductor device shown in FIG. 1 included four edge word lines 102e susceptible to hot electron disturbance, the modified semiconductor device shown in FIG. 2 includes only two edge word lines 102e. Thus, in addition to providing a large gap between neighboring blocks, the semiconductor device of FIG. 2 has fewer word lines susceptible to hot electron disturbance. It should be noted that while FIG. 2 illustrates a string having only two blocks $BLK_n$ and $BLK_{n+1}$, any number of additional blocks may be added to the string.

Turning now to FIG. 3, a top view of a reduced-size semiconductor device is illustrated, in accordance with example embodiments of the present invention. The semiconductor device shown in FIG. 3 demonstrates a further modification of the device illustrated in FIG. 2. Rather than simply producing a gap 202 between neighboring blocks of a string, the semiconductor device of FIG. 3 moves the neighboring blocks closer together, and separates them using one or more dummy word lines 102d. Although illustrated in FIG. 3 as two dummy word lines, in some embodiments, there may be more or fewer dummy word lines 102d separating neighboring blocks in a string. Although the neighboring blocks are closer together in this illustration, the dummy word lines 102d prevent disturbances in one block caused by operations performed on its neighboring block.

In one embodiment, the dummy word lines are floating, and a combination of the impedance of the dummy word lines and the distance between the neighboring blocks creates a sufficient buffer to mitigate potential disturbances. In another embodiment, the dummy word line is provided with a voltage bias, which may disrupt any lateral electrical field that might otherwise prompt the hot electron disturbance during an operation. In yet another embodiment, the dummy word line is connected to a ground, which removes hot electrons from circulation before they are able to move across the dummy word lines 102d from one block to its neighboring block. As noted above, the dummy word lines may comprise a plurality of word lines.

In each case, the presence of the one or more dummy word lines 102d allows complete program, erase, and read functionality, while moving neighboring blocks closer together. Accordingly, as shown in FIG. 3, the chip size may be reduced by a significant margin, because a two block string height is reduced from height 112, as in the semiconductor devices shown in FIGS. 1 and 2, to a reduced string height 302.

It should be noted that while FIG. 3 illustrates a string having only two blocks $BLK_n$ and $BLK_{n+1}$, any number of additional blocks may be added to the string. Notably, each additional block provided to the string, in the configuration shown in FIG. 3, produces a greater degree of efficiency when compared to the traditional device illustrated in FIG. 1, because while additional pluralities of word lines are added with each additional block, no new string select lines 108 or ground select lines 110 are added, and thus for each block added to a semiconductor device, the total string height of a device having the configuration shown in FIG. 3 increases by a smaller margin than the total string height of a device configured in accordance with either of FIG. 1 or 2.

FIGS. 4-6 illustrate example operations that may be performed using the reduced-size semiconductor device, in accordance with example embodiments of the present invention.

FIG. 4 illustrates an embodiment in which dummy word lines 102d are used to avoid disturbance to one block caused by an erase operation performed on a selected neighboring block. In this regard, a block 402 is selected for erasure. This operation may apply a bias to the memory cells of the selected block. Notably, even when a bias is applied to the selected block, the dummy word lines float, along with the unselected blocks of the string.

FIG. 5 illustrates an embodiment in which dummy word lines 102d are used in association with a program operation performed on a selected neighboring block. In this regard, a block 502 is selected for programming. Notably, the dummy word lines 102d need not have associated memory cells, and thus may not be programmed.

FIG. 6 illustrates an embodiment in which dummy word lines 102d are used during a read operation performed on a selected neighboring block. In this example, a block 602 is selected to be read. The operation may apply a pass voltage to the unselected word lines of the string. In this regard, a read operation identifies whether a memory cell contains trapped electrons by establishing a lower voltage to an examined word line and a pass voltage to the all other word lines. Accordingly, the pass voltage is applied to the dummy word lines, in addition to all of the unselected word lines.

Turning now to FIG. 7, a flowchart is illustrated that describes operations performed to manufacture a semiconductor device in accordance with example embodiments of the present invention. In operation 702, a substrate is provided. In operation 704, a plurality of blocks is positioned on the substrate to form a string, wherein each of the plurality of blocks includes a plurality of word lines disposed on the substrate. Of the plurality of word lines, some number of them may comprise dummy word lines between the blocks comprising the remaining word lines. In some embodiments, there need not be any difference between the dummy word lines and the remaining word lines, while in other embodiments, the dummy word lines may be connected to a common ground or a voltage source. In operation 706, a single ground select line associated with the string is formed, wherein the single ground select line is disposed at one side of the plurality of blocks. Finally, in operation 708, a single string select line associated with the string is formed, wherein the single string select line is disposed at another side of the plurality of blocks.

Accordingly, as described herein, a nonvolatile semiconductor device, a method of manufacture, and a method of manipulation thereof are provided that both enable a reduction in chip size and avoid edge word line hot electron disturbance. Moreover, operations to program, erase, or read a cell function well even with a substantially reduced size of the chip. As noted previously, the number of dummy word lines between neighboring blocks is not static, and in different embodiments may include different numbers of dummy word lines. In this regard, in some embodiments no dummy lines are used, and a gap 202 may be sufficient. Furthermore, while illustrated for simplicity with two neighboring blocks in a string, as noted throughout this application, any number of blocks may be used in connection with embodiments of the present invention. In some embodiments, the dummy word lines may comprise any suitable technology, and are not restricted to any specific material and/or structure. Finally, although some embodiments of the present invention comprise NAND flash memory devices, embodiments of the present invention are contemplated for use in other nonvolatile semiconductor devices, such as NOR flash memory or the like.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A nonvolatile semiconductor device comprising:
   a substrate;
   a plurality of blocks forming a string, wherein each block is positioned on the substrate and includes a plurality of word lines disposed on the substrate;
   a single ground select line associated with the string, wherein the single ground select line is disposed at one side of the plurality of blocks; and
   a single string select line associated with the string, wherein the single string select line is disposed at another side of the plurality of blocks.

2. The nonvolatile semiconductor device of claim 1, wherein the word lines of the plurality of blocks define gaps separating each block of the string from neighboring blocks of the string.

3. The nonvolatile semiconductor device of claim 1, wherein a dummy word line is disposed in a gap between a first block and a second block of the plurality of blocks of the string.

4. The nonvolatile semiconductor device of claim 3, wherein the dummy word line is a floating dummy word line.

5. The nonvolatile semiconductor device of claim 3, wherein the dummy word line has a voltage bias.

6. The nonvolatile semiconductor device of claim 3, wherein the dummy word line is connected to a ground.

7. The nonvolatile semiconductor device of claim 3, wherein the dummy word line comprises a plurality of word lines.

8. The nonvolatile semiconductor device of claim 1, wherein the semiconductor device comprises a flash memory.

9. The nonvolatile semiconductor device of claim 8, wherein the semiconductor device comprises a NAND flash memory.

10. A method of manipulating the semiconductor device of claim 3, the method comprising:
    selecting a first block of the plurality of blocks forming the string; and
    performing an operation on the selected block.

11. The method of claim 10, wherein the operation comprises an erase operation, and wherein a bias applied to the plurality of word lines of the selected block to erase data stored in memory cells of the selected block is not applied to the dummy word line.

12. The method of claim 10, wherein the operation comprises a program operation, and wherein a bias applied to the plurality of word lines of the selected block to program memory cells of the selected block is not applied to the dummy word line.

13. The method of claim 10, wherein the operation comprises a read operation, and wherein a pass voltage is applied to the dummy word line.

* * * * *